(12) United States Patent
Uang et al.

(10) Patent No.: US 7,479,702 B2
(45) Date of Patent: Jan. 20, 2009

(54) COMPOSITE CONDUCTIVE FILM AND SEMICONDUCTOR PACKAGE USING SUCH FILM

(75) Inventors: Rouh Huey Uang, Hsinchu (TW); Yu-Chih Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 268 days.

(21) Appl. No.: 11/333,346

(22) Filed: Jan. 18, 2006

(65) Prior Publication Data

US 2006/0113656 A1 Jun. 1, 2006

Related U.S. Application Data

(63) Continuation-in-part of application No. 10/998,741, filed on Nov. 30, 2004.

(30) Foreign Application Priority Data

Nov. 11, 2005 (TW) .............................. 94139773 A

(51) Int. Cl.
*H01L 23/48* (2006.01)
*H01L 23/52* (2006.01)
(52) U.S. Cl. ...................... 257/774; 257/784; 257/723; 257/783; 257/E23.169; 977/762
(58) Field of Classification Search ................. 257/784, 257/774, 690, 723, E23.169; 977/762
See application file for complete search history.

(56) References Cited

U.S. PATENT DOCUMENTS

| 5,019,944 | A | * | 5/1991 | Ishii et al. ..................... 361/783 |
| 5,399,898 | A | * | 3/1995 | Rostoker ..................... 257/499 |
| 5,805,426 | A | | 9/1998 | Merritt et al. |
| 6,489,685 | B2 | * | 12/2002 | Asahi et al. ................... 257/774 |
| 6,580,031 | B2 | | 6/2003 | Chung |
| 6,581,726 | B1 | | 6/2003 | Petzl et al. |
| 6,849,802 | B2 | | 2/2005 | Song et al. |
| 7,189,435 | B2 | * | 3/2007 | Tuominen et al. ........... 427/472 |
| 2003/0017647 | A1 | | 1/2003 | Kwon et al. |
| 2004/0238936 | A1 | * | 12/2004 | Rumer et al. ................ 257/688 |

FOREIGN PATENT DOCUMENTS

| CN | 1779868 A | 5/2006 |
| JP | 2002-368189 | 12/2002 |
| TW | 1244188 B | 11/2005 |

\* cited by examiner

*Primary Examiner*—Nitin Parekh
(74) *Attorney, Agent, or Firm*—Rabin & Berdo, P.C.

(57) ABSTRACT

A composite conductive film and a semiconductor package using such film are provided. The composite conductive film is formed of a polymer-matrix and a plurality of nano-sized conductive lines is provided. The composite conductive film has low resistance, to connect between a fine-pitch chip and a chip in a low temperature and low pressure condition. The conductive lines are parally arranged and spaced apart from each other, to provide anisotropic conductivity. The present conductive film can be served as an electrical connection between a fine-pitch chip and a chip or a fine-pitch chip and a substrate.

12 Claims, 16 Drawing Sheets

COMPOSITE CONDUCTIVE FILM AND SEMICONDUCTOR PACKAGE USING SUCH FILM

CROSS-REFERENCE TO RELATED APPLICATIONS

This application is a continuation-in-part patent application of U.S. application Ser. No. 10/998,741 filed on Nov. 30, 2004, for "Structure of polymer-matrix conductive film and method for fabricating the same". This application is also claims priority under 35 U.S.C. § 119(a) on Patent Application No(s). 094139773 filed in Taiwan, R.O.C. on Nov. 11, 2005. Each of theses application is incorporated herein by reference in its entirety.

BACKGROUND

1. Field of Invention

The invention relates to an anisotropic conductive film (ACF), especially to a composite conductive film that is made by polymers and nanowires.

2. Related Art

In packaging techniques a variety of chip packages has been developed, such as a flip chip and a multi-chip module (MCM). Among them, the flip chip technology uses solder bumps to connect the input/output electrodes of the chip and the substrate. However, a mismatch caused by the difference between the coefficient of thermal expansion (CTE) of the chip and that of the substrate makes the connection unstable. Therefore, a common way to solve this problem is dispensing an underfill between the chip and the substrate after the assembly. Nevertheless, if spacing between the chip and the substrate is limited under 100 µm, the present underfill material will be hard to be filled into the spacing.

The present solutions include: 1. replacing the ball type solder bump with a high aspect ratio copper column to increase the spacing between the chip and the substrate; 2. replacing the ball type solder bump with a conductive polymer bump so that it can be a stress buffer by its low Young's modulus property. However, these two methods both have disadvantages. The copper column applied in the first method has a higher Young's modulus than the solder bump. Therefore it the stress can't be buffered. About the second method, because a current conductive polymer still owns a resistivity ten times larger than metal, it is not suitable to be applied to an advanced and developed flip chip package which has tiny a space and a small electrode area.

A multi-chip module (MCM) is a package where multiple chips, whether they have the same function or not, are packaged on one carrier. Because a MCM owns a faster transmission speed, a shorter transmission path, a better electric performance and a much smaller package size and surface area, it can be applied in all kinds of electric devices, making it a foreseeable mainstream product.

There are two kinds of MCM, a 2 dimensions MCM (2D MCM) and a 3 dimensions MCM (3D MCM). A 3D MCM has a better miniaturization outcome than a 2D MCM. Therefore it has become a major development topic in recent years. The solder bump used in a flip chip also can be used in a 3D MCM for chip to chip stacking or for chip stacking by an interposer. Nevertheless, the thickness obtained by applying these two packaging techniques still is thicker in application. Therefore, another method uses a metal electrode of the input/output electrodes (such as a copper of a copper chip) instead of the carriers and the solder bumps, to stack the provided chips. The thickness of chip used in this kind of technology can be less than 30 µm, therefore more than 10 layers can be stacked together to become a system on chip (SOC). Except for increasing the functions and providing miniaturization, this method can reduce the numbers of input/output terminals between the chip and the substrate. Therefore the substrate area and the required number of layers can be reduced, cutting down the overall cost.

However, the 3D stack package has the following problems: 1. lower stability, caused by the higher temperature and pressure used in a metal diffusion bonding process; 2. extra protection, required for preventing the thin chip from damage; 3. chips with different functions, having different input/output positions; 4. smaller spacing for input/output terminals, because the increased numbers of input/output terminals, when connecting multilayer chips; and 5. heat dissipation.

U.S. Pat. No. 6,849,802 provides a chip stack package where the original input/output are rewired to the edge of the bare chip, to be the connection members between the two stacked chips, and a conductive adhesive is used between the two chips to form a vertical electrical connection. Therefore, the original input/output between chips can still be electrically connected by conductive bumps. Nevertheless, rewiring the input/output to the edge of the bare chip may cause a decrease of the spacing for the input/output and decrease in the area for the input/output and therefore the difficulties of bonding process in chip stacking increase. Moreover, the sidewall conductive adhesive used in the chip stack package for stabilizing the structure generally has a large contacting resistance with the metal joint. Therefore it hardly satisfies the high speed requirement of an advanced chip.

Accordingly, a low resistance anisotropic conductive film, which is suitable for tiny spacing and for applying a low temperature and low pressure bonding process is developed.

SUMMARY

According to the forgoing problems, a polymer conductive film and a semiconductor package using such film are provided in this specification. The polymer conductive film includes an anisotropic conductive film, having nanowires which are suitable for electrically connecting two chips that have little spacing there between. Among them, a high surface energy property of the nanowires is applied to reduce the required temperature and pressure, which will be in a metal diffusion bonding process. Also, a polymer material in the nanowire conductive film is applied for protecting said thin chip and for increasing the strength of the 3D structure. Besides, the conductive redistribution layer can be designed to solve the problem of the different input/output positions between stacked chips.

According to the invention, a first embodiment of the polymer conductive film includes: a polymer conductive film with a single electric conducting direction, the polymer conductive film having a plurality of wires, separated parallelly, and a polymer material filled between the wires wherein at least one side of the polymer conductive film has at least one opening, by which most of the wires are exposed.

According to the invention, a second embodiment of the polymer conductive film includes: a polymer conductive film with a single electric conducting direction, the polymer conductive film having a plurality of wires separated parallelly and a polymer material filled between the wires, wherein most of the wires are exposed on at least one side of the polymer conductive film.

According to the invention, a third embodiment of the polymer conductive film includes: a polymer conductive film with a single electric conducting direction, the polymer conductive film having at least one wire group, and a polymer material filled between the wire groups, wherein every wire group has a plurality of wires separated parallelly and every wire group is exposed on at least one side of the polymer conductive film.

According to the invention, a fourth embodiment of the polymer conductive film includes: a polymer conductive film with a single electric conducting direction, the polymer conductive film having at least two layers of wires that are separated parallelly, a plurality of conductive redistribution layers and a polymer material filled between the wires, wherein the conductive redistribution layers are formed on one side of the bonding surface of each layer of wires, along the electric conducting direction.

According to the invention, a fifth embodiment of the polymer conductive film includes: a polymer conductive film with a single electric conducting direction, the polymer conductive film having at least two layers of wires that are separated parallelly, a plurality of conductive redistribution layers and a polymer material filled between the wires, wherein the conductive redistribution layers are formed on one side of the bonding surface of each layer of wires along the electric conducting direction, and at least one side of the polymer conductive film has at least one opening, by which most of the wires are exposed.

According to the invention, a sixth embodiment of the polymer conductive film includes: a polymer conductive film with a single electric conducting direction, the polymer conductive film having at least two layers of wires that are separated parallelly, a plurality of conductive redistribution layers and a polymer material filled between the wires, wherein the conductive redistribution layers are formed on one side of the bonding surface of each layer of wires along the electric conducting direction, and each wire is exposed on at least one side of the polymer conductive film.

According to the invention, a seventh embodiment of the polymer conductive film includes: a polymer conductive film with a single electric conducting direction, the polymer conductive film having at least one wire group that has at least two layers of wires, a plurality of conductive redistribution layers and a polymer material filled between the wires, wherein every wire group has a plurality of wires separated parallelly and the conductive redistribution layers are formed on one side of the bonding surface of each layer of wires, along the electric conducting direction, and at least one wire group is exposed on at least one side of the polymer conductive film.

The polymer conductive film, disclosed in this specification, is composed of nanowires and polymer materials. The polymer material has flexible and stress absorption properties. Therefore it can be used for buffering the stress and increasing the thin chip strength in a later semiconductor device assembly process. Besides, because of the nanowires of the polymer conductive film, the chip can be electrically connected to the other chip, using a low temperature and low pressure metal bonding process, which provides a low connection resistance effect. Moreover, the different positions of the joints between the two bonding chips can be solved by using the conductive redistribution layer.

In addition, according to the invention, a semiconductor package using the polymer conductive films described above includes: a substrate, a polymer conductive film and a chip. The substrate has an electrical pattern, connected to first pads. The polymer conductive film includes a plurality of wires, separated parallelly, and a polymer material filled between the wires where the wires are exposed on the two sides of the polymer conductive film and one end of the wires contact the first pad. The chip is disposed at one side of the polymer conductive film, which is opposite to the substrate. There are several second pads located on the side of the chip, which contacts the polymer conductive film. The second pad contacts the other end of the wires to electrically connect the substrate and the chip through the polymer conductive film.

Another semiconductor package includes: a first polymer conductive film, a second polymer conductive film, a first chip, a second chip and a third chip. The first polymer conductive film and the second polymer conductive film both have a plurality of wires separated parallelly and a polymer material filled between the wires. The first chip, the second chip and the third chip all have electrical patterns, connected to the pads. Also, the pads of the first chip contact the wires of the first polymer conductive film, the wires on the side of the first polymer conductive film, which is opposite the first chip, contact the pads on one side of the second chip. The pads on the other side of the second chip contact the wires of the second polymer conductive film, and the wires on the side of the second polymer conductive film, which is opposite the second chip, contact the pads of the third chip for electrically connecting the first chip. The second chip and the third chip are connected to each other through the first polymer conductive film and the second polymer conductive film.

BRIEF DESCRIPTION OF THE DRAWINGS

The present invention will become more fully understood from the detailed description given below, which is for illustration only and is not limitative of the present invention, wherein.

DETAILED DESCRIPTION

A tiny spacing anisotropic conductive film (ACF) is provided in this specification. The tiny spacing anisotropic conductive film is composed of a nanowire 10 and a polymer material. Therefore it is suitable for any application that has spacing at least the nano scale. On the other hand, in order to maintain a good X-Y direction insulation property for the wires 10 and the polymer conductive film, a Z direction parallelism should be kept. A high aspect ratio wire 10, such as the current used wire 10, which has a diameter less than 200 nanometer and a length more than 10 micrometer, will be easy to be inclined by a force from outside. Therefore the polymer material used in this specification is selected from the polymer materials which have a high glass transition temperature (Tg), such as a thermoset polymer with a Tg higher than 250° C. Moreover, in order to increase the bonding strength between the chips, the polymer material 15 in the polymer conductive film should have flexible properties and stress absorption properties.

The polymer conductive film is a composite conductive film that consists of nanowires and the polymer materials. The nanowire can include a metal, which has a low resistance and an anti-oxidation property, such as a gold, a silver or a multi layer nano metal line with a solder. The polymer material can include a thermoset polymer that has a small Young's modulus and a Tg high than 250° C., to maintain the Z direction parallelism and to release the stress caused during the bonding between two chips.

The polymer conductive film will be described below with respect to the figures.

Figure 1:
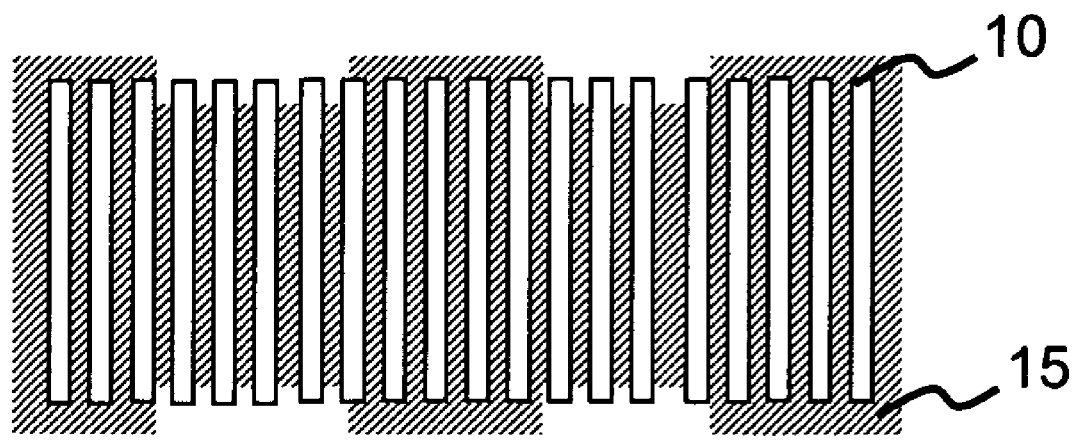
FIG. 1 is a cross section view showing the first embodiment of a polymer conductive film according to the invention.

FIG. 1 is a cross section view of a first embodiment of the polymer conductive film. The polymer conductive film has a plurality of wires 10 that are separated parallelly and have a Z direction conductivity and a spacing less than 200 nanometer, and a polymer material 15 filled between the wires 10 by a method such as a diffusion process. The wires 10 can include a high conductivity material such as gold, silver, cobalt or nickel. The polymer material 15 can include a thermoset polymer material, which has a small Young's modulus, for example, an epoxy or a polyimide.

Then, the polymer material 15 located on one side or both sides of the polymer conductive film has at least one opening, and one end or both ends of most wires 10 are exposed by the opening. The opening can be formed by a dry etching pattening process, such as plasma etching, to remove the polymer material 15 that is located at the predetermined bonding position between the polymer conductive film and the chip.

The polymer conductive film in the first embodiment is used as an electric connection between the chips. The chip to chip electric connection can be achieved by using a low temperature, low pressure metal bonding process to connect the two chips respectively to the two ends of the wires 10 of the polymer conductive film.

Figure 2:
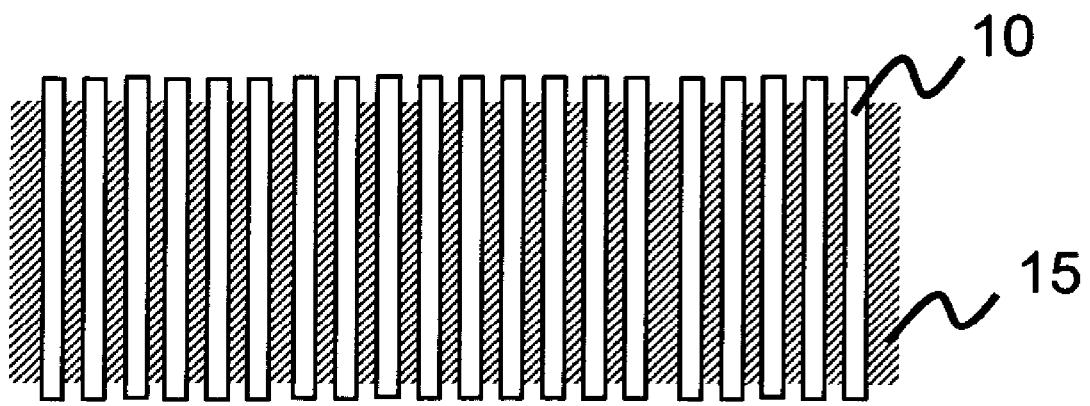
FIG. 2 is a cross section view showing the second embodiment of a polymer conductive film according to the invention.

FIG. 2 is a cross section view of a second embodiment of the polymer conductive film. According to the first embodiment, similarly, the polymer conductive film has a plurality of wires 10 that are separated parallelly and have a Z direction conductivity and a spacing less than 200 nanometer, and a polymer material 15 filled between the wires 10 by a method such as a diffusion process. However in the present embodiment, the differences of the polymer materials on one side or two sides of the polymer conductive film are removed by a dry etching patterning process, such as plasma etching, to expose one or two ends of the wires 10 on one side or both sides of the polymer conductive film.

Figure 3:
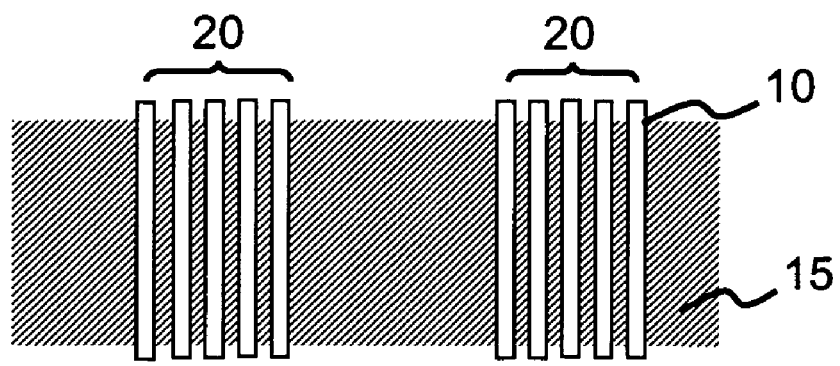
FIG. 3 is a cross section view showing the third embodiment of a polymer conductive film according to the invention.

FIG. 3 is a cross section view of a third embodiment of the polymer conductive film. According to the first embodiment, similarly, the polymer conductive film has a Z direction conductivity and a polymer material 15, filled between the wires 10 by a method, such as a diffusion process. However in the present embodiment, the differences of the wires 10 of the polymer conductive films are set in groups 20, and every group 10 has a plurality of wires that are separated parallelly and have a spacing less than 200 nanometer. Also, the polymer materials on one side or two sides of the polymer conductive film are removed by a dry etching patterning process, such as plasma etching, to expose one or two ends of each wire group 10 on one side or both sides of the polymer conductive film.

Figure 4:
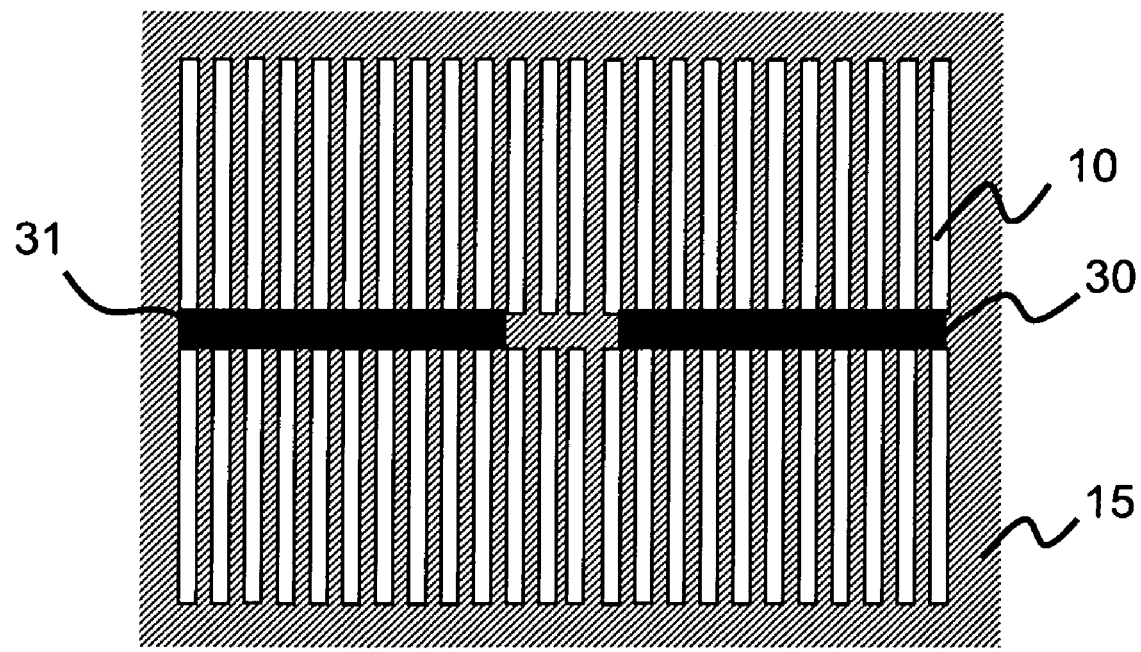
FIG. 4 is a cross section view showing the fourth embodiment of a polymer conductive film according to the invention.

FIG. 4 is a cross section view of a fourth embodiment of the polymer conductive film. The polymer conductive film is used as an electric connection between the chips. The chip to chip electric connection can be achieved by connecting the two chips respectively to at least one end of the wires 10 of the polymer conductive film. The polymer conductive film has a plurality of wires 10 that are separated parallelly and have a Z direction conductivity, a plurality of conductive redistribution layers 30, 31 and a polymer material 15 filled between the wires 10 by a method, such as a diffusion process. The conductive redistribution layers 30, 31 are formed on the conjunction surface between the wire layers 10 and can be spaced at equal or random intervals along the conductive direction. The wires 10 can include a high conductive material, such as gold, silver, cobalt or nickel. The polymer material 15 can include a thermoset polymer material 15, which has a small Young's modulus, such as an epoxy or a polyimide.

The polymer conductive film in this embodiment is used as an electric connection between the chips or the chip and the substrate. The chip to chip electric connection can be achieved by using a low temperature, low pressure metal bonding process to connect the two chips respectively to the one or two ends of the wires 10 of the polymer conductive film. Moreover, the polymer conductive film enlarges the input/output spacing between the polymer conductive film and the chip by using the conductive redistribution layer 30, 31 to extend the electric connection between the wires 10. Therefore, even the input/output spacing is getting smaller with the development of the chip, the chip still can electric connect to the current chip or the substrate by the polymer conductive film, adapting itself to the advanced flip chip package with a tiny spacing. Briefly, the polymer conductive film not only provides the vertical electric connection but also adapts to the input/output redistribution. Therefore it makes the current substrate be capable to the advanced, tiny spacing chip package.

Figure 5:
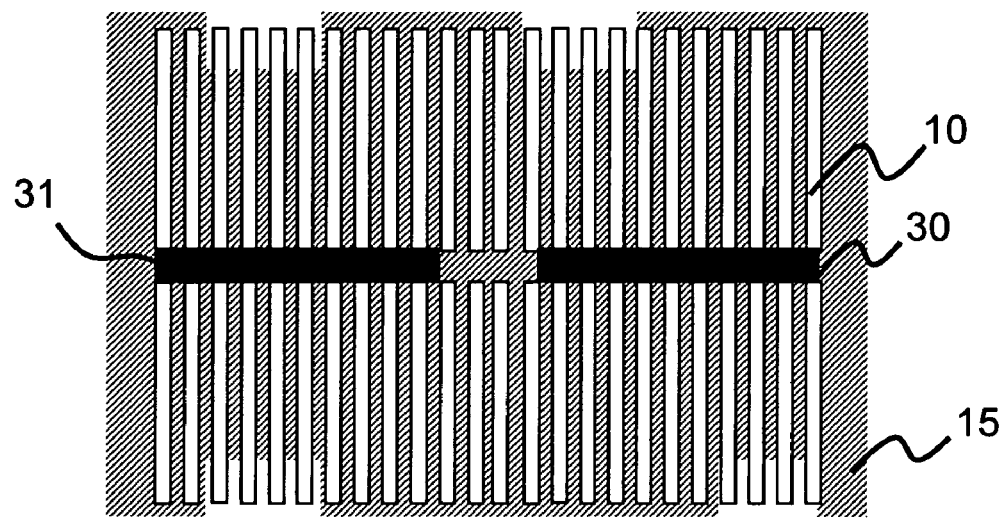
FIG. 5 is a cross section view showing the fifth embodiment of a polymer conductive film according to the invention.

FIG. 5 is a cross section view of the fifth embodiment of the polymer conductive film. Based on the fourth embodiment, similarly, the polymer conductive film has layers of wires 10 that are separated parallelly and have a Z direction conductivity, a plurality of conductive redistribution layers 30, 31 and a polymer material 15 filled between the wires 10 by a method, such as a diffusion process. The different polymer materials on one side or two sides of the polymer conductive film have at least one opening, which exposes one end of the wires 10. Every opening can be formed by a dry etching patterning process, such as plasma etching, to remove the polymer materials located at the predetermined bonding area between the polymer conductive film and the chip.

Figure 6:
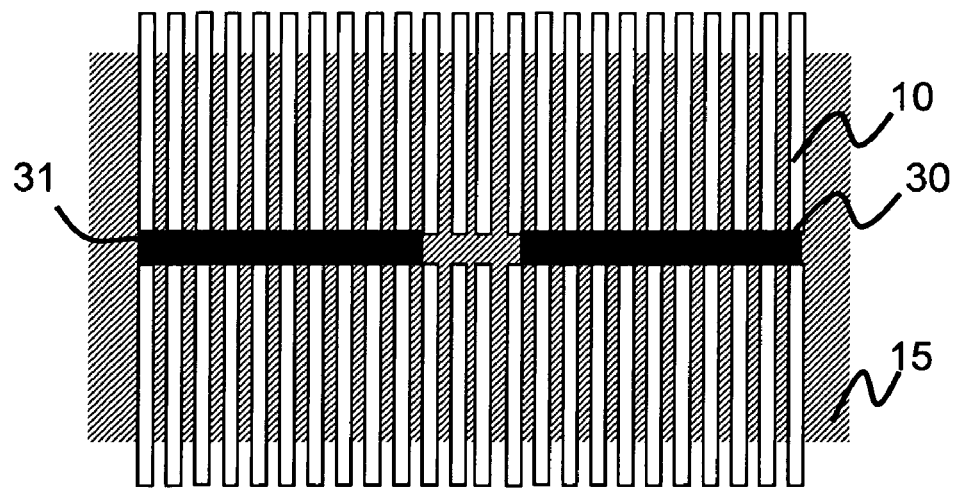
FIG. 6 is a cross section view showing the sixth embodiment of a polymer conductive film according to the invention.

FIG. 6 is a cross section view of the sixth embodiment of the polymer conductive film. Based on the fourth embodiment, similarly, the polymer conductive film has layers of wires 10 that are separated parallelly and have a Z direction conductivity, a plurality of conductive redistribution layers 30, 31 and a polymer material 15 filled between the wires 10 by a method, such as a diffusion process. The different polymer materials on one side or two sides of the polymer conductive film are removed by a dry etching patterning process, such as plasma etching to expose one end of the wires 10.

Figure 7:
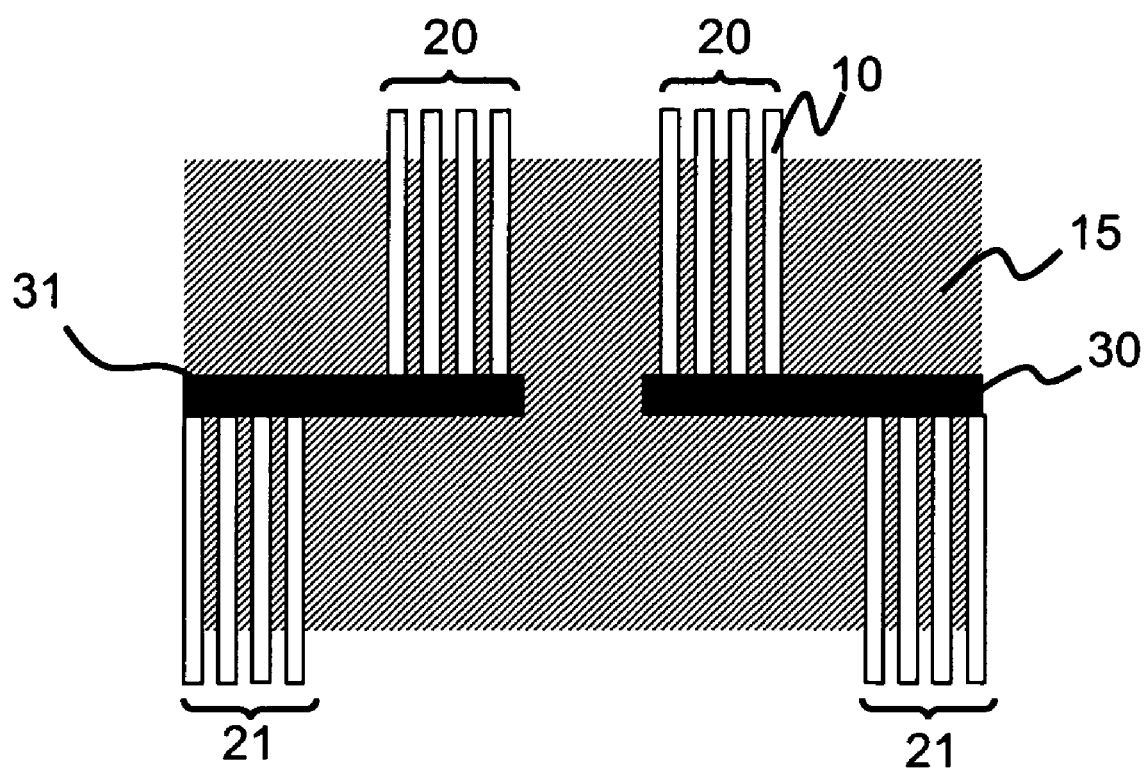
FIG. 7 is a cross section view showing the seventh embodiment of a polymer conductive film according to the invention.

FIG. 7 is a cross section view of a seventh embodiment of the polymer conductive film. Based on the fourth embodiment, similarly, the polymer conductive film has a Z direction conductivity, a plurality of conductive redistribution layers 30, 31 and a polymer material 15 filled between the wires 10 by a method, such as a diffusion process. The different wires of the polymer materials are structured as multi layers and include at least one wire group 20, 21. Every layer of the wire groups 20, 21 includes a plurality of wires 10 that are separated parallelly and have a spacing less than 200 nanometer. One side or two sides of the polymer conductive film are removed by a dry etching patterning process, such as a plasma etching, to expose one end of the wire groups 20, 21.

The polymer conductive films described above are composed of nanowires 10 and polymer materials. The polymer material has flexible and stress absorption properties. Therefore, it can be used for buffering the stress and increasing the strength of the thin chip in the later semiconductor device assembly process. Besides, because of the use of the nanowires in the polymer conductive film, the chip can be electrically connected to the other chip, using a low temperature and low pressure metal bonding process, which provides a low connection resistance effect.

In a semiconductor package, the foregoing polymer conductive films can be used between the chips 50 and between the substrate 40 and the chip 50 as well. For example, in FIG. 8, the polymer conductive film of the semiconductor package 100 shown in FIG. 1 is used for being an electric connection between the substrate 40 and the chip 50. The substrate 40 has an electric pattern thereon, connecting to a plurality of electrodes (first pads) 41. The chip 50 includes several electrodes (second pads) 51. The electrodes (second pads) 51 on the chip 50 and the electrodes 41 on the substrate 40 respectively contact the two ends of the multi wires 10 exposed by the opening on the two sides of the polymer conductive film, to connect the substrate 40 and the chip 50 electrically. The parts outside the electrodes 41 of the substrate 40 and outside the electrodes 51 of the chip are filled by the polymer material 15. Therefore, adhesive dispensing is not necessary. In addition, because the polymer material has flexible and stress absorption properties, it is suitable for being used for buffering the stress and for increasing the strength of the thin chip.

Among them, the positions of the openings on the two sides of the polymer conductive film are decided according to the electrodes (second pads) 51 on the chip 50 and the electrodes 41 on the substrate 40. When the positions of the electrodes (second pads) 51 on the chip 50 correspond to those of the electrodes 41 on the substrate 40, the openings on the two sides of the polymer conductive film will expose the two ends of the wires 10. On the other hand, when the positions of the electrodes (second pads) 51 on the chip 50 don't correspond to those of the electrodes 41 on the substrate 40, the openings on the two sides of the polymer conductive film will expose one ends or two ends of the wires 10.

Figure 8:
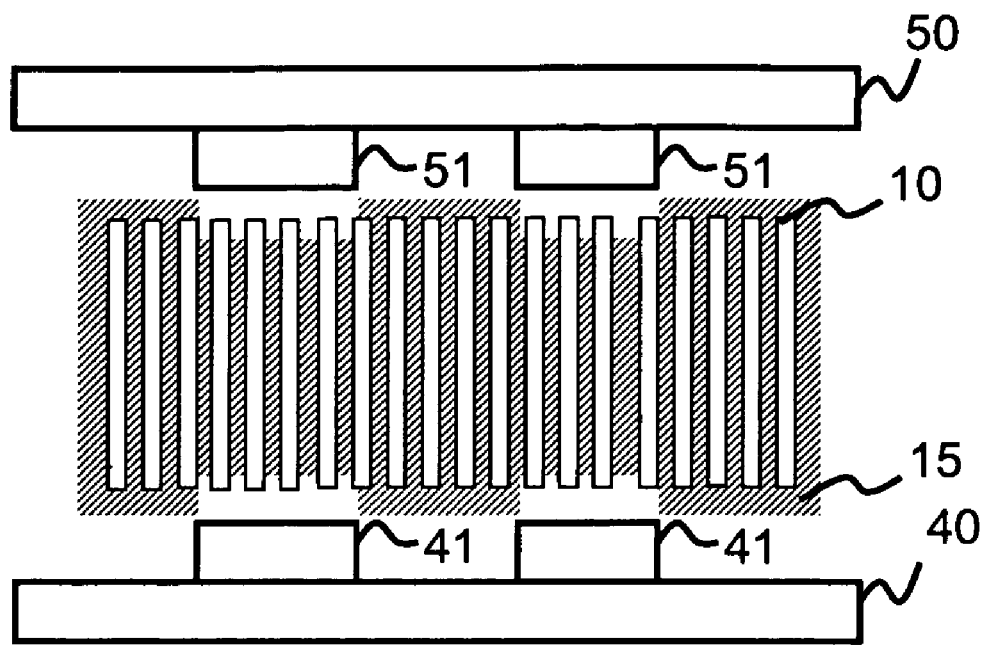
FIG. 8 is a cross section view showing a semiconductor package using the first embodiment of the polymer conductive film according to the invention.
Figure 9:
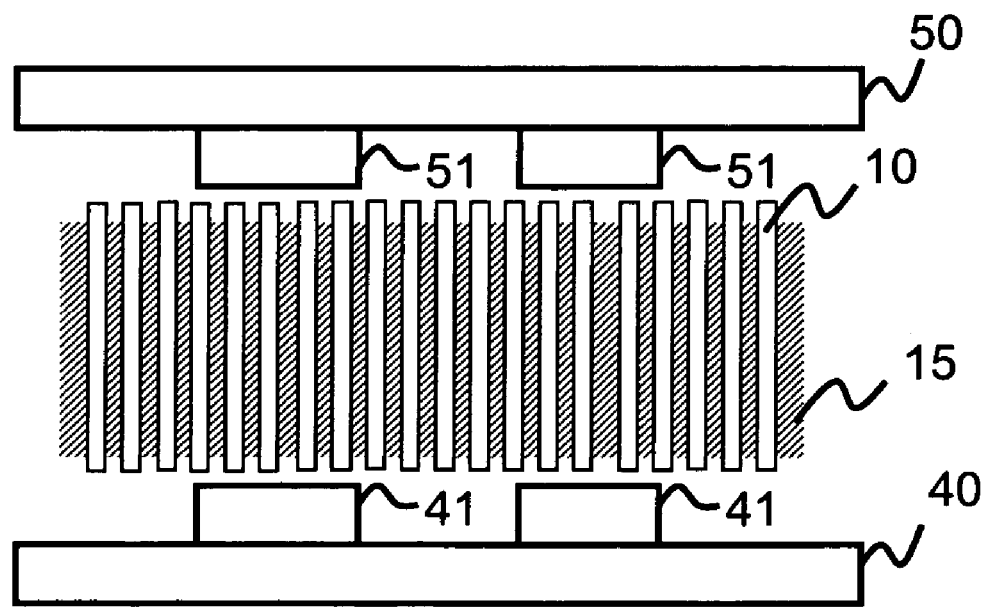
FIG. 9 is a cross section view showing a semiconductor package using the second embodiment of the polymer conductive film according to the invention.

Besides, based on the semiconductor package in FIG. 8, the polymer conductive film can be the one used in the second and third embodiments. However, when the electrodes (second pads) 51 on the chip 50 electrically connect to the electrodes 41 on the substrate 40 through the polymer conductive films shown in the second or third embodiment, the parts outside the electrodes 41 of the substrate 40 and outside the electrodes 51 of the chip will connect to the polymer material 15, using an adhesive dispensing process to increase the strength of the package. In FIG. 9, the polymer conductive film of the semiconductor package 100 shown in FIG. 3 is used for being an electric connection between the substrate 40 and the chip 50, where the two ends of the wires 10 are exposed on the two sides of the polymer conductive film.

Figure 10:
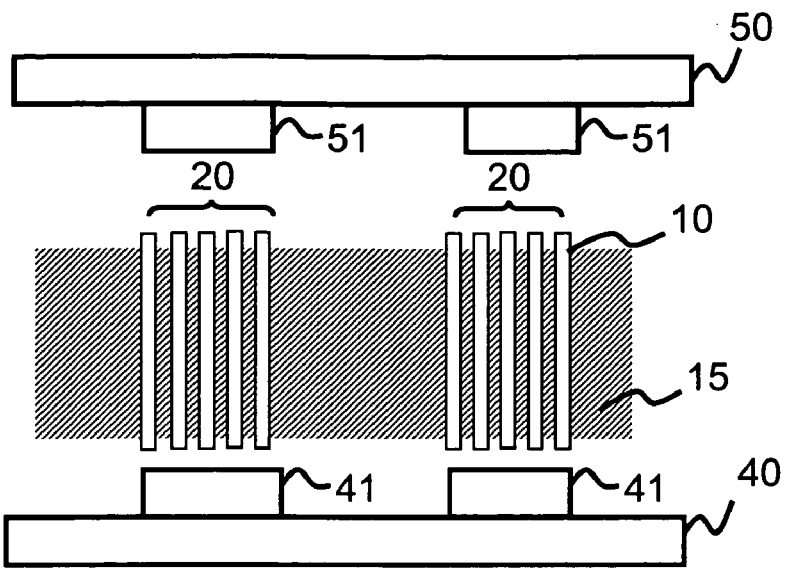
FIG. 10 is a cross section view showing a semiconductor package using the third embodiment of the polymer conductive film according to the invention.

In FIG. 10, the polymer conductive film of the semiconductor package shown in FIG. 3 is used for being an electric connection between the substrate 40 and the chip 50, where the two ends of the wires 20 are exposed on the two sides of the third embodiment's polymer conductive film (please refer to FIG. 3) for being the electric connection between the substrate 40 and the chip 50. However, the parts outside the electrodes 41 of the substrate 40 and outside the electrodes 51 of the chip need an adhesive dispensing process to connect them to the polymer material 15 for increasing the strength of the package.

Figure 11:
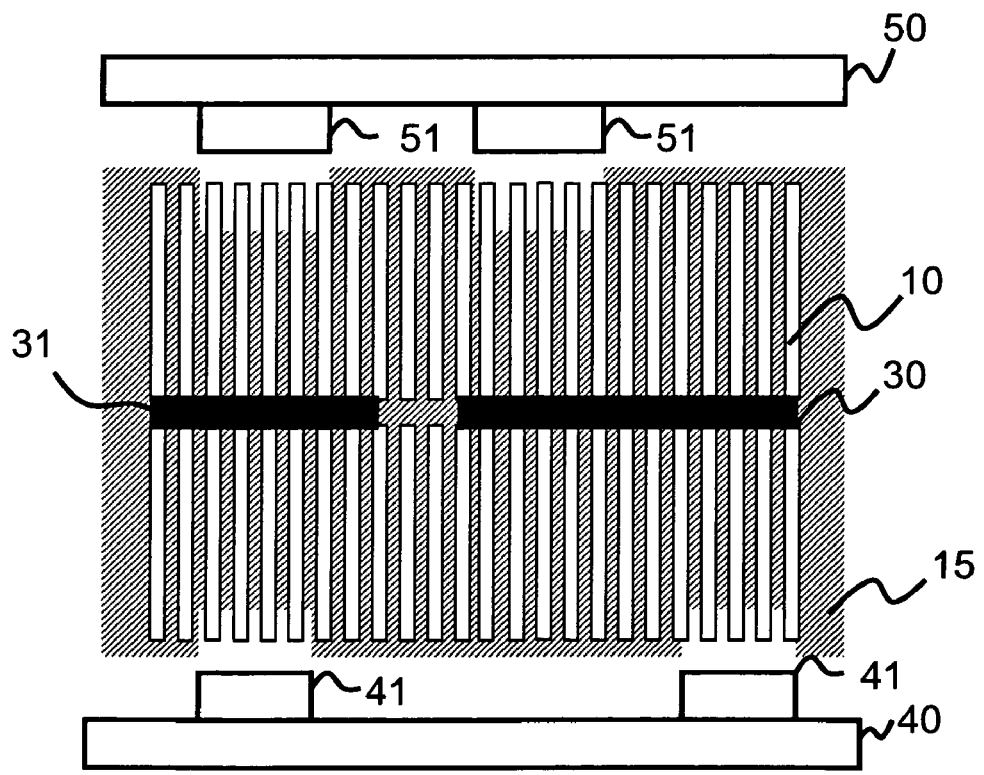
FIG. 11 is a diagram showing a semiconductor package using the fifth embodiment of the polymer conductive film according to the invention.

In FIG. 11, the polymer conductive film of the semiconductor package shown in FIG. 5 is used for being an electric connection between the substrate 40 and the chip 50. There are an electric pattern and electrodes 41 that have a plurality of input/output with larger spacing on the substrate 40, where the input/output electricity connects to the electric pattern. The electrodes (second pads) 51 of the chip 50 electrically connect to one end of the wires 10 in the opening of the polymer conductive film, and the electrodes 41 of the substrate 40 electrically connect to one end of the wires 10 in an opening that is on another side of the polymer conductive film. The parts outside the electrodes 41 of the substrate 40 and the electrodes 51 of the chip 50 connect to the polymer material 15 of the polymer conductive film. Therefore the adhesive dispensing process is not necessary. Since the conductive redistribution layer 30, 31 within the polymer conductive film, can enlarge the input/output spacing for the electric contact between the polymer conductive film and the substrate 40, the package in FIG. 11 can be used for assembling the current substrate 40 into an advanced, tiny spacing chip package.

The polymer conductive film in the semiconductor package shown in FIG. 11 also can be the polymer conductive film used in the fourth, sixth and seventh embodiments. However, when a substrate 40 electrically connects to a chip 50 through a polymer conductive film shown in the sixth and the seventh embodiments, the parts outside the electrodes 41 of the substrate 40 and the electrodes 51 of the chip 50 need an adhesive dispensing process to connect to the polymer conductive film for increasing the strength of the package.

Figure 12:
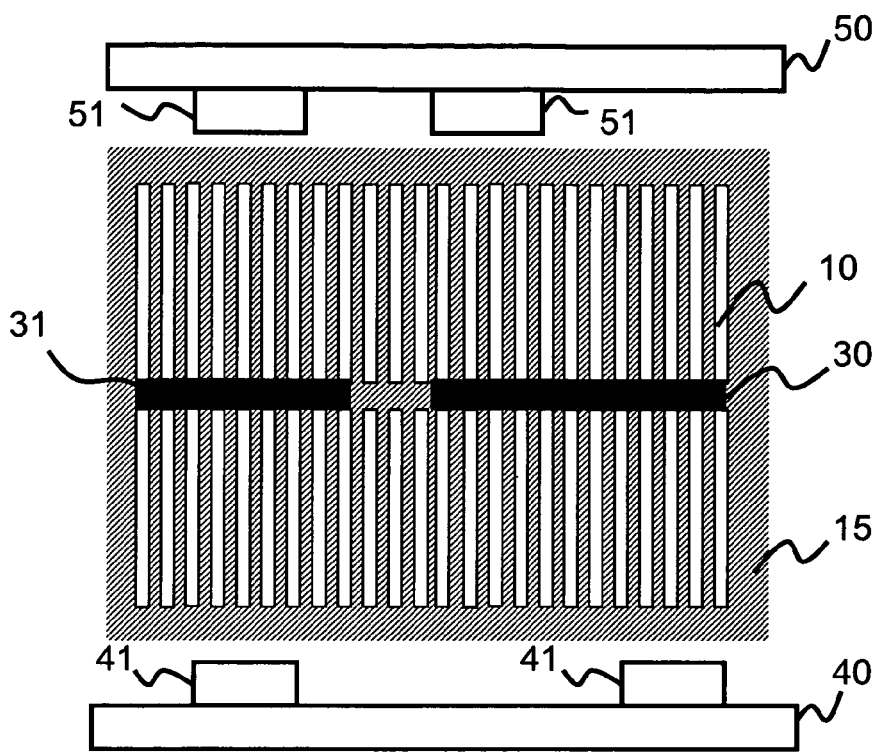
FIG. 12 is a diagram view showing a semiconductor package using the fourth embodiment of the polymer conductive film according to the invention.

In FIG. 12, the polymer conductive film in the fourth embodiment (shown in FIG. 4) is used for being an electric connection between the substrate 40 and the chip 50. Among them, the substrate 40 and the chip connect to the polymer conductive film (shown in FIG. 4) by a low temperature, low pressure metal bonding process. Neither forming an opening on two sides of the polymer conductive film, nor an adhesive dispensing process are unnecessary or necessary to connect the parts outside the electrodes 41 of the substrate 40 and the electrodes 51 of the chip 50 to the polymer conductive film.

Figure 13:
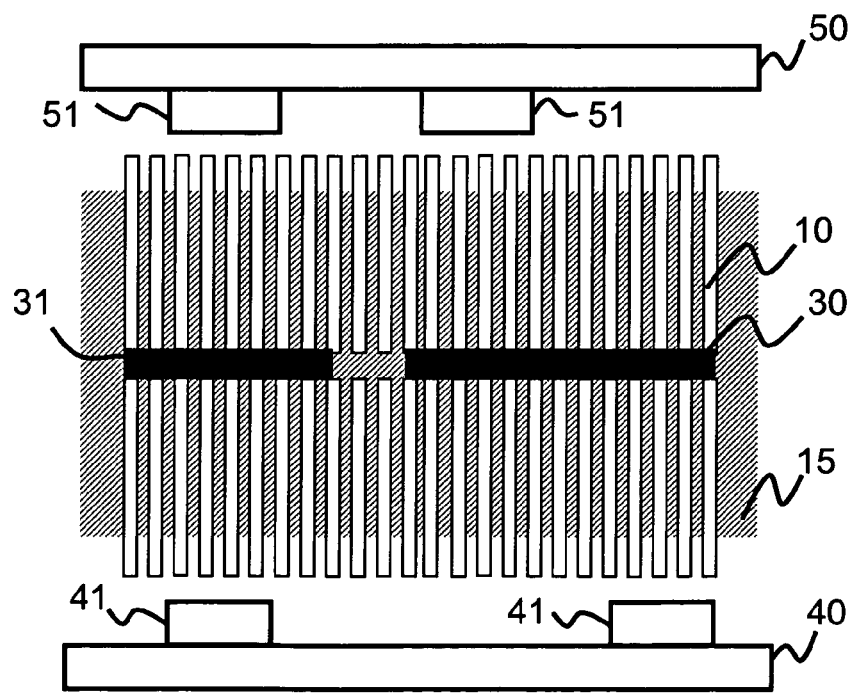
FIG. 13 is a diagram view showing a semiconductor package using the sixth embodiment of the polymer conductive film according to the invention.

In FIG. 13, the polymer conductive film in the sixth embodiment (shown in FIG. 6) is used for being an electric connection between the substrate 40 and the chip 50. Among them, both sides of the polymer conductive film in the sixth embodiment (please refer to FIG. 6) expose the two ends of the wires for providing an electric connection between the substrate 40 and the chip 50.

Figure 14:
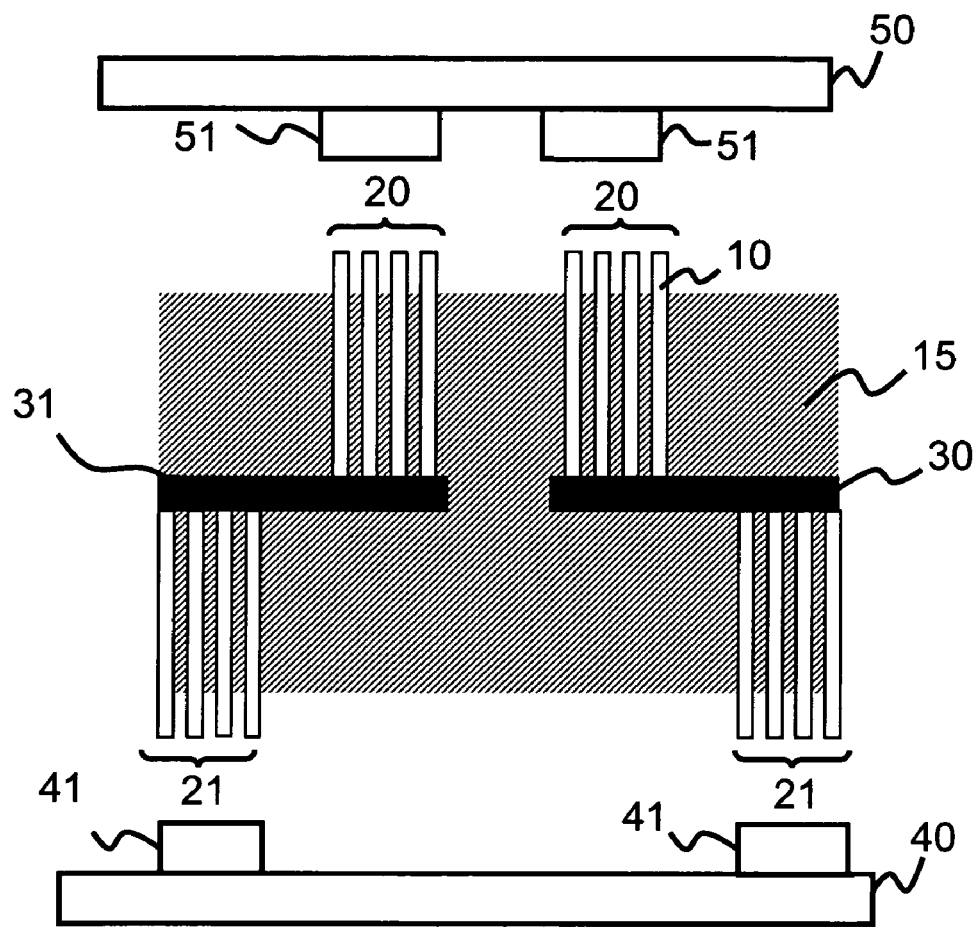
FIG. 14 is a diagram view showing a semiconductor package using the seventh embodiment of the polymer conductive film according to the invention.

In FIG. 14, the polymer conductive film in the seventh embodiment (shown in FIG. 7) is used for being an electric connection between the substrate 40 and the chip 50. Among them, the electrodes 41 of the substrate 40 and the electrodes 51 of the chip 50 are electrically connected to each other by contacting one end of the wire groups 20 that are exposed on the two sides of the polymer conductive film (please refer to FIG. 7).

If there are several chips needed to be stacked together, the foregoing polymer films also can be used as an electric connection between the chips. For example, in FIG. 15, pluralities of polymer conductive films in the first embodiment (please also refer to FIG. 1) are used for being the electric connections between the first chip 60, the second chip 70 and the third chip 80. The first chip 60, the second chip 70 and the third chip 80 all have electric patterns, and the electrodes 61, 71, 72, 81 have larger input/output spacing and are connected to the foregoing electric patterns. In a package shown in FIG. 15, the electrode 61 of the first chip 60 electrically contacts one end of the wires 10 in an opening that is on one side of the first polymer conductive film 65, and the electrode 71, which is on one side of the second chip 70, electrically contacts one end of the wires 10 in an opening on a side of the first polymer conductive film 65 that is opposite the first chip 60. Therefore, the first chip 60 can be electrically connected to the second chip 70 through the first polymer conductive film.

Next, the electrode 72 on another side of the second chip 70 electrically contacts one end of the wires 10 in an opening on one side of the second polymer conductive film 66, and the electrode 81 of the third chip 80 electrically contacts one end of the wires 10 in an opening on a side of the second polymer conductive film 66, which is opposite the second chip 70, for electrically connecting the second chip 70 to the third chip 80 through the second polymer conductive film. The package in FIG. 15 uses the first and the second polymer conductive films 65, 66 for buffering stress to achieve the purpose of protecting the stacked chips and increase the strength of the structure.

Figure 15:
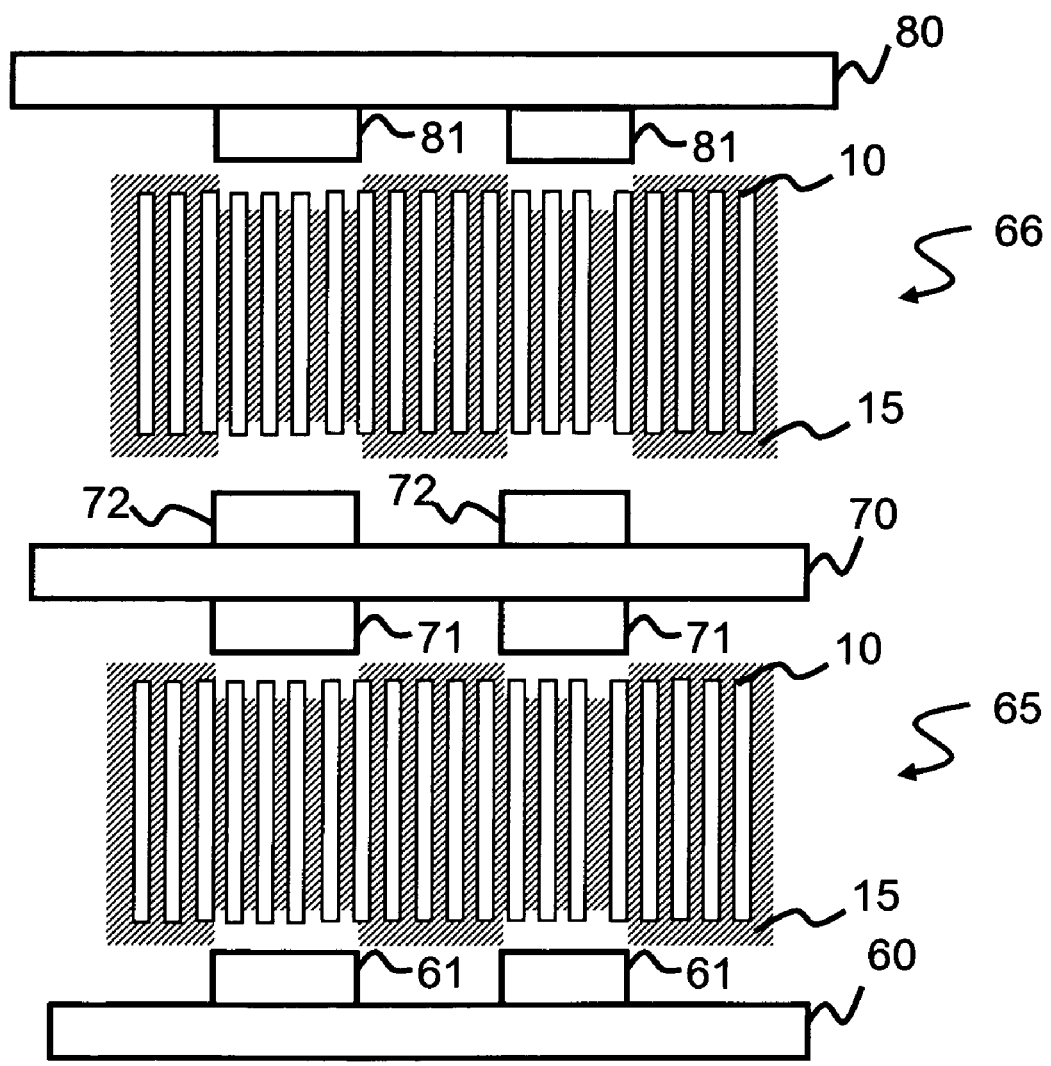
FIG. 15 is a diagram view showing a semiconductor package using the first embodiment of the polymer conductive films according to the invention.
Figure 16:
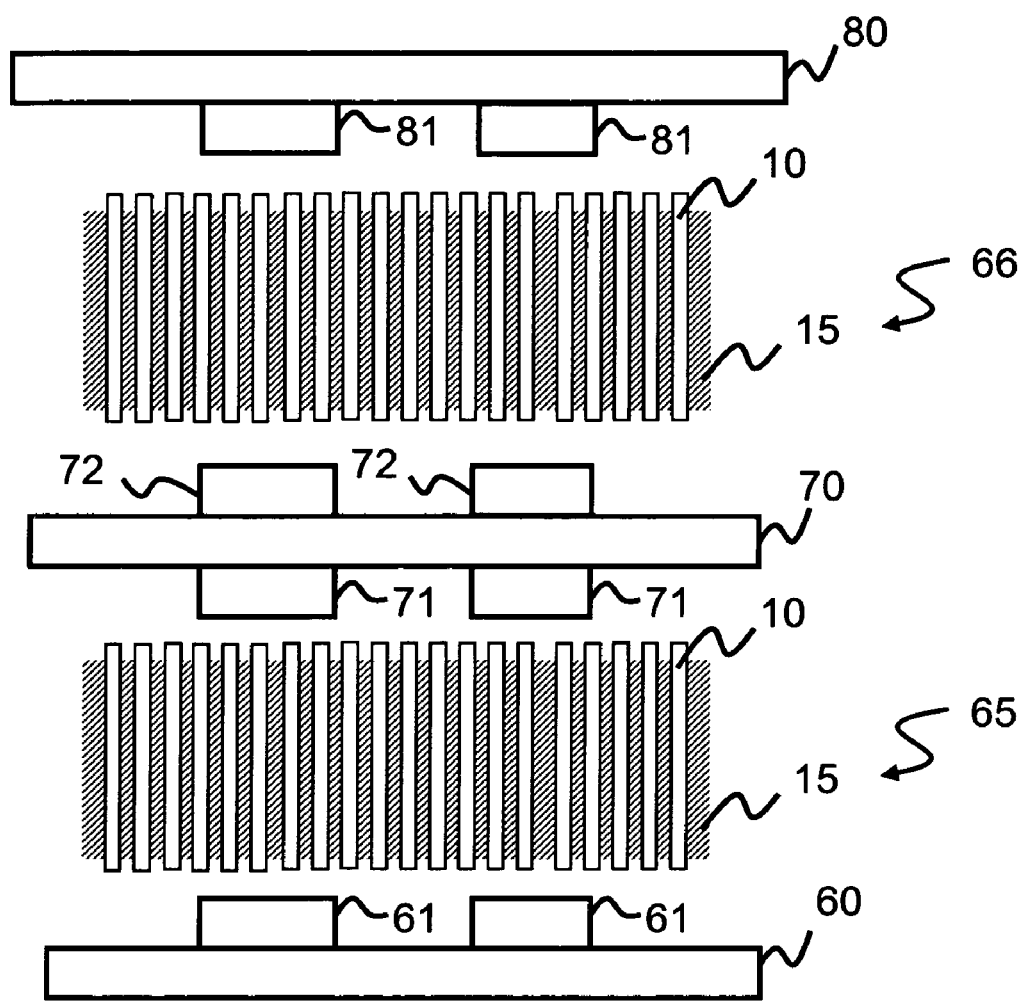
FIG. 16 is a diagram view showing a semiconductor package using the second embodiment of the polymer conductive films according to the invention.
Figure 17:
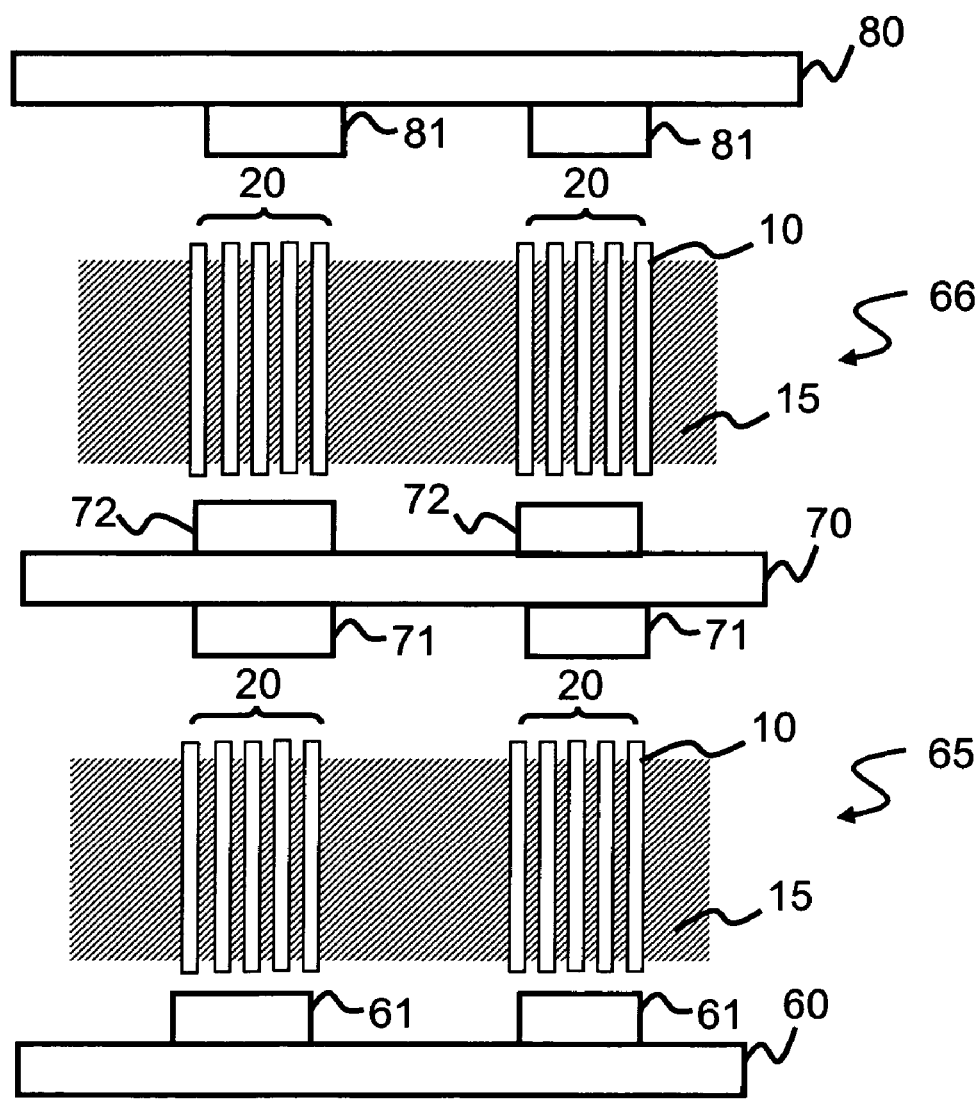
FIG. 17 is a diagram view showing a semiconductor package using the third embodiment of the polymer conductive films according to the invention.
Figure 18:
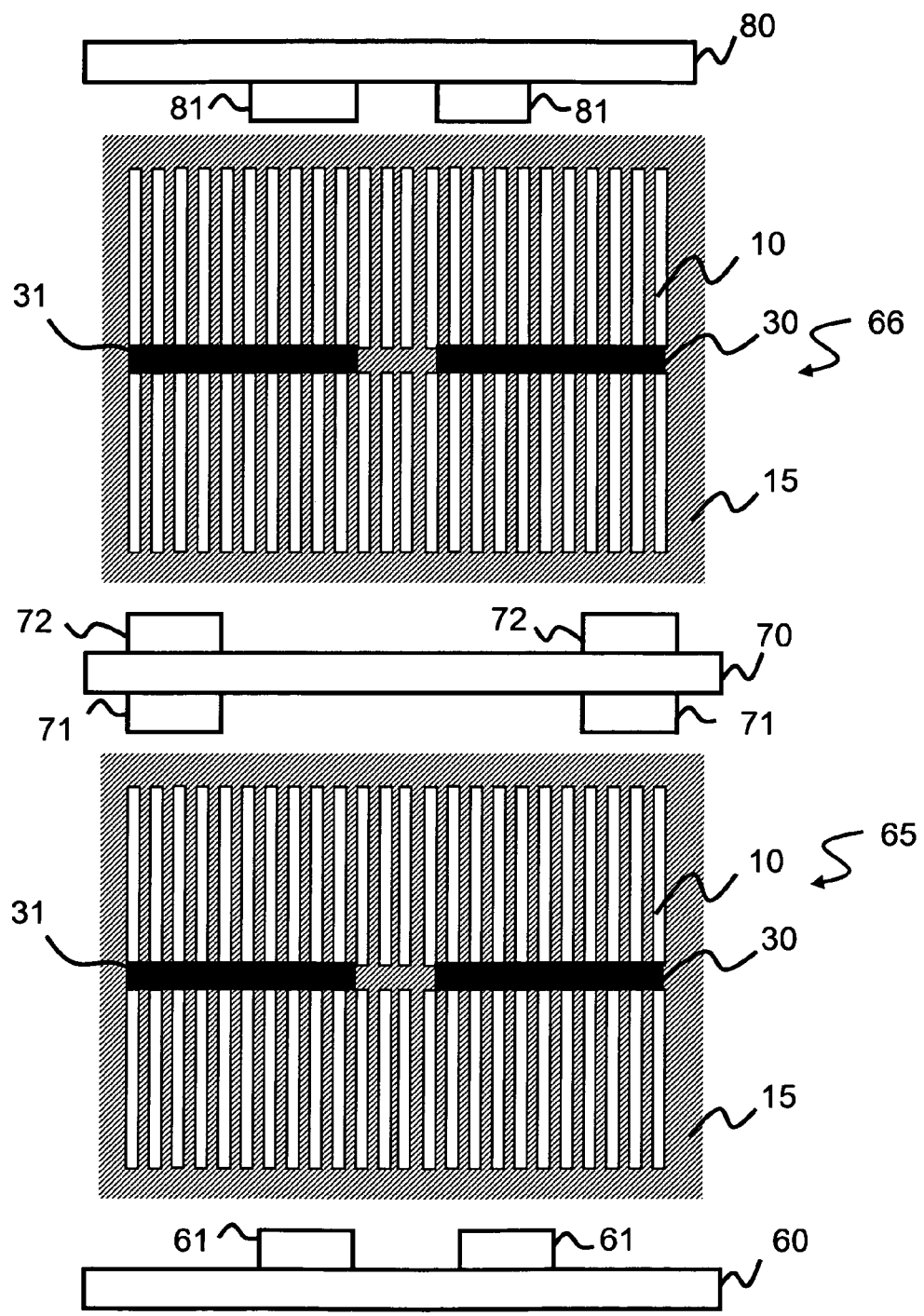
FIG. 18 is a diagram view showing a semiconductor package using the fourth embodiment of the polymer conductive films according to the invention.
Figure 19:
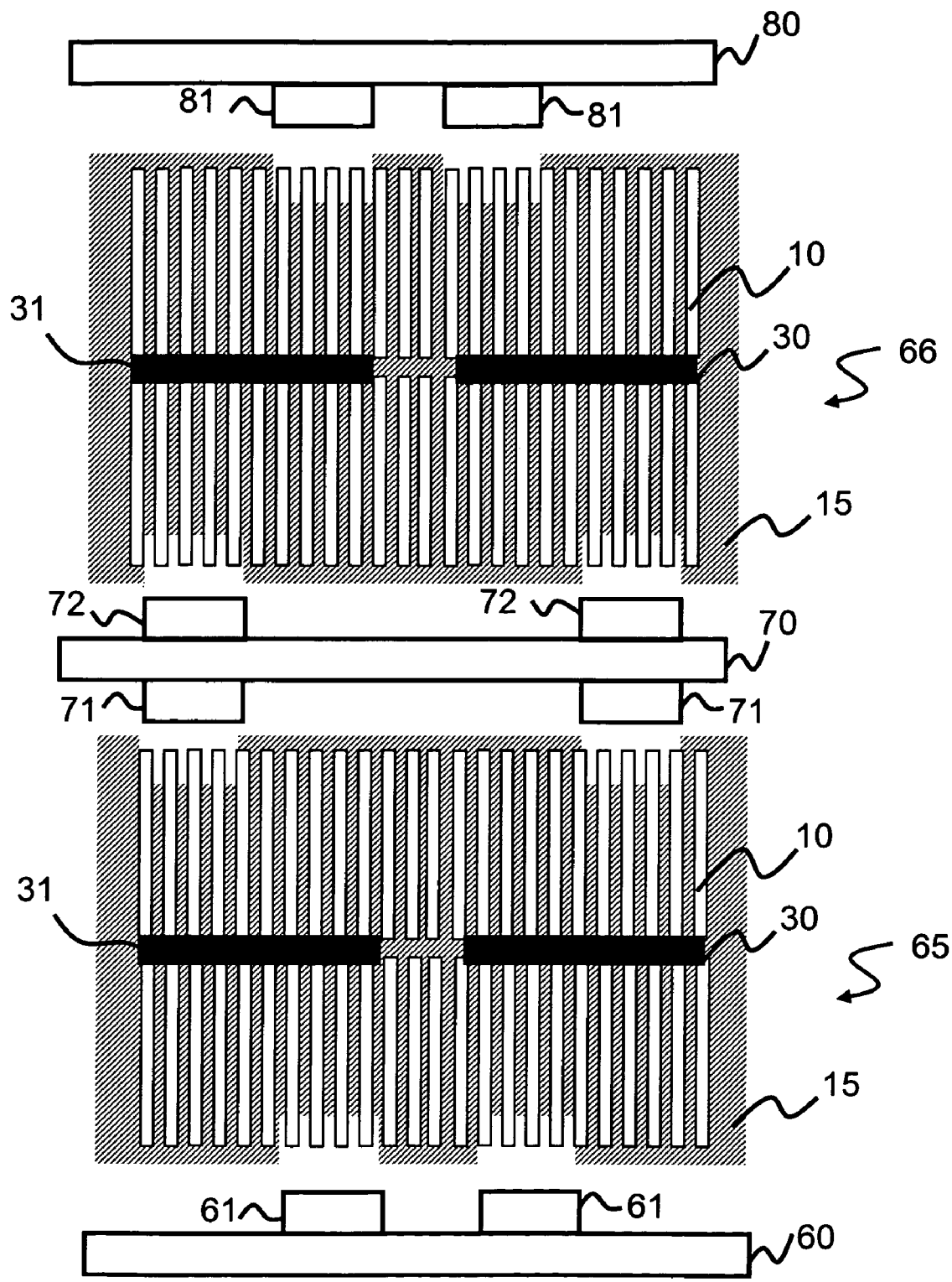
FIG. 19 is a diagram view showing a semiconductor package using the fifth embodiment of the polymer conductive films according to the invention.
Figure 20:
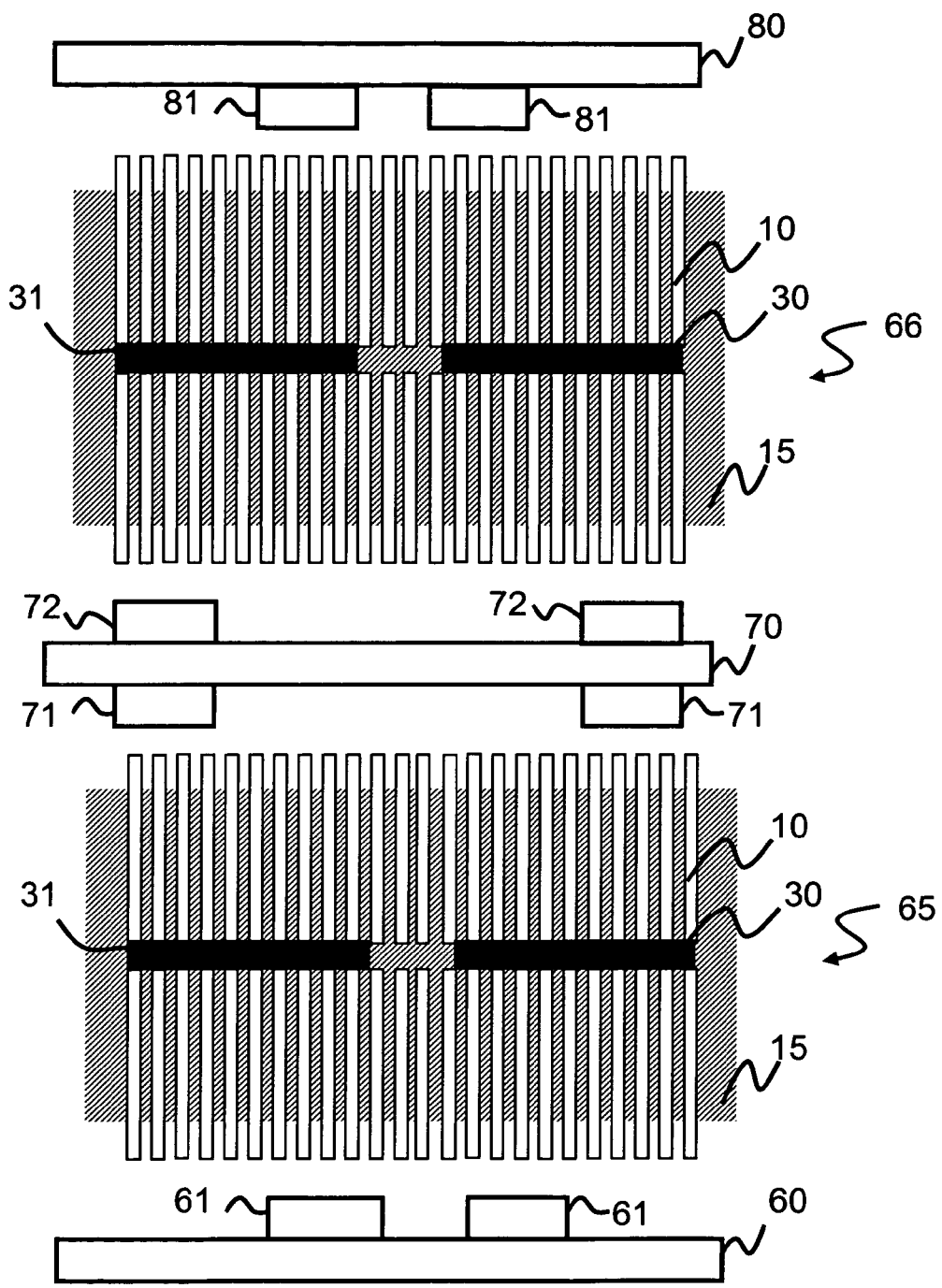
FIG. 20 is a diagram view showing a semiconductor package using the sixth embodiment of the polymer conductive films according to the invention.
Figure 21:
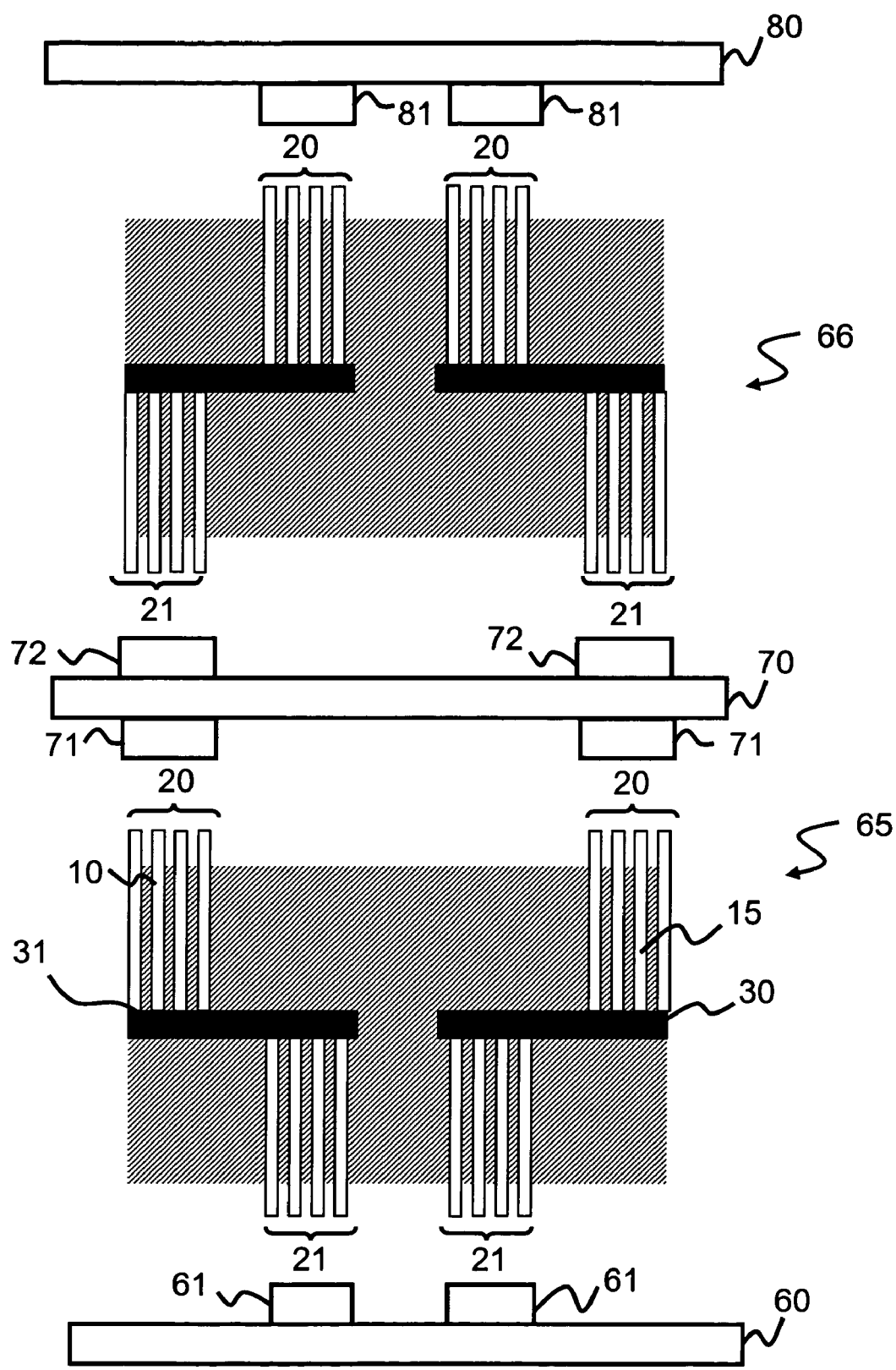
FIG. 21 is a diagram view showing a semiconductor package using the seventh embodiment of the polymer conductive films according to the invention.

Similarly, the first and the second polymer conductive films used in FIG. 15 can be any of the embodiments of the polymer conductive films shown in the second, third, fourth, fifth, sixth and the seventh, such as FIG. 16 (also refer to FIG. 2), FIG. 17 (also refer to FIG. 3), FIG. 18 (also refer to FIG. 4), FIG. 19 (also refer to FIG. 5), FIG. 20 (also refer to FIG. 6) and FIG. 21 (also refer to FIG. 7).

Among them, when the foregoing various polymer conductive films are used in the semiconductor package in FIG. 15, several wires are exposed on both sides of the first polymer conductive film 65 and on those of the second polymer conductive film 66 for electrically connecting the stacked chips. (the first chip 60, the second chip 70 and the third chip 80). An adhesive dispensing process will then be provided to connect the exposed ends of wires to the polymer conductive film, to increase the strength of the package. However, when the polymer conductive film of the fourth embodiment (please refer to the FIG. 4) is used as a first polymer conductive film 65 and the second polymer conductive film 66 is used for providing the electric connection, it is unnecessary to expose the wires on both sides of the first polymer conductive film 65 and on those of the second polymer conductive film 66. Instead, both sides of the first polymer conductive film 65 and those of the second polymer conductive film 66 can be directly connected to the stacked chips even without the adhesive dispensing process. Moreover, the first polymer conductive film 65 and the second polymer conductive film 66 can be different types.

Figure 22:
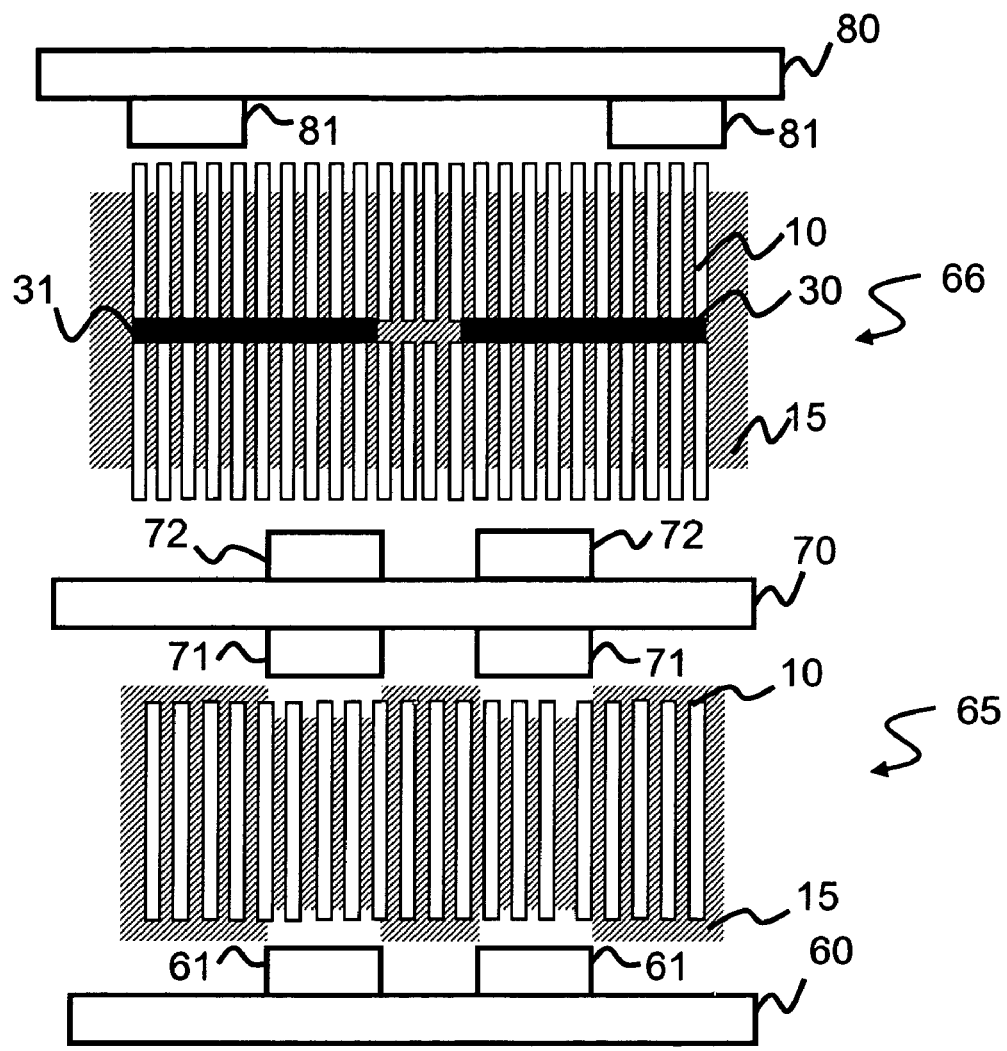
FIG. 22 is a diagram view showing a semiconductor package using the first embodiment and the sixth embodiment of the polymer conductive films according to the invention.

For example, in FIG. 22, a polymer conductive film of the first embodiment (also the first polymer conductive film in FIG. 15) and a polymer conductive film of the sixth embodiment (also the second polymer conductive film in FIG. 15) are used for being electric connections between the first chip 60, the second chip 70 and the third chip 80. The electric connections between the first chip 60, the second chip 70 and the third chip 80 can be accomplished by contacting one or both ends of the wires 10 of the polymer conductive film, using a low temperature and a low pressure metal bonding process. Moreover, the second chip 70 and the third chip 80 can electrically connect to each other through a polymer conductive film of the sixth embodiment. Therefore, the differential problems between two chip's input/output positions in a process of stacking chips can be solved.

However, if the first chip 60, the second chip 70 and the third chip 80 are electrically connected to each other by one kind of polymer conductive film in one of the second, the third, the sixth and the seventh embodiments, the parts outside the electrodes of the first chip 60, the second chip 70 and the third chip 80 will use an adhesive dispensing process to connect to the polymer conductive film for increasing the strength of the package.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A semiconductor package comprising:
   a first polymer conductive film and a second polymer conductive film, each of the polymer conductive films having at least two layers of parallel and separated wires, and a polymer material between the wires; and
   a first chip, a second chip and a third chip, each of the chips including an electric pattern connected to a plurality of pads, wherein the pads of the first chip contact a layer of the wires of the first polymer conductive film, a layer of the wires on one side of the first polymer conductive film that is opposite to the first chip contact the pads on a top side of the second chip, the pads on a bottom side of the second chip that is on the other side of the top side of the second chip contact a layer of the wires of the second polymer conductive film, and a layer of the wires on a side of the second polymer conductive film which is opposite to the second chip contact the pads of the third chip for electrically connecting the first chip, the second chip and the third chip to each other through the first and the second polymer conductive films.

2. The semiconductor package of claim 1, wherein the polymer material is a thermoset polymer.

3. The semiconductor package of claim 1, wherein each of the polymer conductive films has a single electrically conducting direction.

4. The semiconductor package of claim 1, wherein each of two sides of the first polymer conductive film has at least one opening and at least one end of one of the wires of the first polymer conductive film is exposed by the opening.

5. The semiconductor package of claim 1, wherein each of two sides of the second polymer conductive film has at least one opening and at least one end of one of the wires of the second polymer conductive film is exposed by the opening.

6. The semiconductor package of claim 1, wherein two layers of the wires of the first polymer conductive film are respectively exposed on two sides of the first polymer conductive film.

7. The semiconductor package of claim 1, wherein two layers of the wires of the second polymer conductive film are respectively exposed on two sides of the second polymer conductive film.

8. The semiconductor package of claim 1, wherein the first polymer conductive film has a plurality of conductive redistribution layers, and each of the conductive redistribution layers is interposed between two adjacent layers of the wires of the first polymer conductive film along an electrically conducting direction.

9. The semiconductor package of claim 8, wherein each of two sides of the first polymer conductive film has at least one opening and one end of one of the wires of the first polymer conductive film is exposed by the opening.

10. The semiconductor package of claim 1, wherein the second polymer conductive film has a plurality of conductive redistribution layers, and each of the conductive redistribution layers is interposed between two adjacent layers of the wires of the second polymer conductive film along an electrically conducting direction.

11. The semiconductor package of claim 10, wherein each of two sides of the first polymer conductive film has at least one opening and one end of one of the wires of the first polymer conductive film is exposed by the opening.

12. The semiconductor package of claim 1,
wherein the first polymer conductive film has a plurality of first conductive redistribution layers, and each of the first conductive redistribution layers is interposed between two adjacent layers of the wires of the first polymer conductive film along a first electrically conducting direction;
wherein each of two sides of the first polymer conductive film has at least one first opening and one end of one of the wires of the first polymer conductive film is exposed by the first opening;
wherein the second polymer conductive film has a plurality of second conductive redistribution layers, and each of the second conductive redistribution layers is interposed between two adjacent layers of the wires of the second polymer conductive film along a second electric conducting direction; and
wherein each of two sides of the second polymer conductive film has at least one second opening and one end of one of the wires of the second polymer conductive film is exposed by the second opening.

* * * * *